United States Patent [19]

Takami

[11] Patent Number: 5,229,321
[45] Date of Patent: Jul. 20, 1993

[54] METHOD OF DIFFUSING MERCURY INTO A CRYSTALLINE SEMICONDUCTOR MATERIAL INCLUDING MERCURY

[75] Inventor: Akihiro Takami, Itami, Japan

[73] Assignee: Mitsubishi Denki Kabushiki Kaisha, Tokyo, Japan

[21] Appl. No.: 895,690

[22] Filed: Jun. 9, 1992

[30] Foreign Application Priority Data

Nov. 20, 1991 [JP] Japan .................. 3-334323

[51] Int. Cl.⁵ ........................... H01L 21/225
[52] U.S. Cl. .................. 437/161; 437/987; 148/DIG. 64
[58] Field of Search ........... 437/134, 135, 160, 161, 437/247, 965, 987, 3, 5, 139, 140; 148/DIG. 3, DIG. 63, DIG. 64, DIG. 80, 559; 156/DIG. 82, DIG. 73; 257/188; 420/526

[56] References Cited

U.S. PATENT DOCUMENTS

| | | | |
|---|---|---|---|
| 4,494,133 | 1/1985 | Dean et al. | 257/188 |
| 4,588,446 | 5/1986 | Tregilgas | 148/DIG. 64 |
| 4,927,773 | 5/1990 | Jack et al. | 437/161 |
| 4,960,728 | 10/1990 | Schaake et al. | 437/987 |
| 5,028,296 | 7/1991 | Tregilgas | 156/DIG. 82 |
| 5,079,192 | 1/1992 | Tregilgas et al. | 148/DIG. 64 |

OTHER PUBLICATIONS

Parat et al, "Annealing And Electrical Properties of $Hg_{1-x}Cd_xTe$ Grown By OMVPE", Journal of Crystal Growth 106, 1990, pp. 513-523.

Primary Examiner—Brian E. Hearn
Assistant Examiner—C. Chaudhari
Attorney, Agent, or Firm—Leydig, Voit & Mayer

[57] ABSTRACT

A method of diffusing mercury into a crystalline compound semiconductor film including mercury includes forming an amalgam on a region of the semiconductor film into which mercury is to be diffused, forming a protective film on the amalgam, and annealing, whereby mercury from the amalgam diffuses into the semiconductor film and the protective film prevents the mercury from escaping. Therefore, a complicated temperature profile is not required and the mercury diffusion is carried out without sealing the semiconductor film in a quartz tube. As a result, the instruments and materials used in the diffusion process are easily handled and the diffusion of mercury into a large-sized semiconductor film is possible.

14 Claims, 6 Drawing Sheets

FIG. 6 (PRIOR ART)
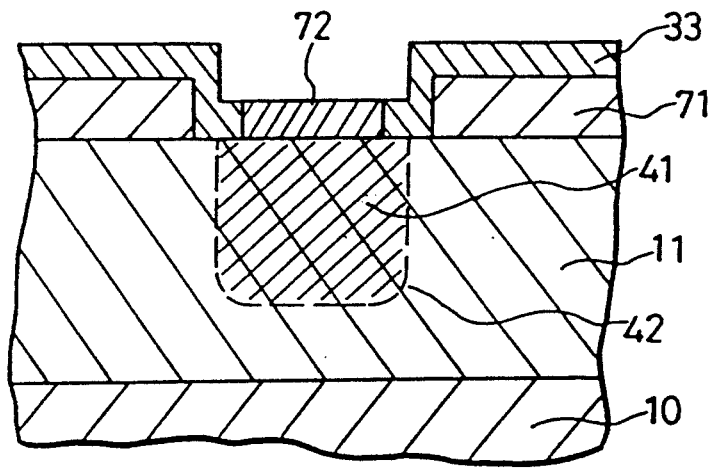
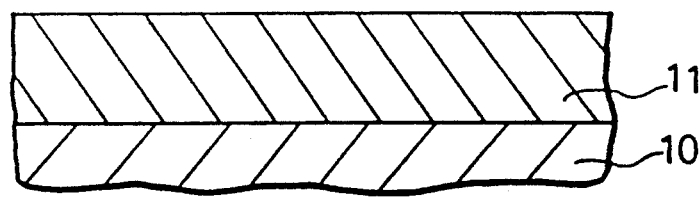
FIG. 7(a) (PRIOR ART)
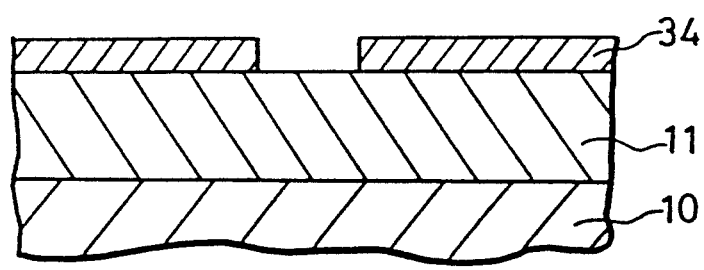
FIG. 7(b) (PRIOR ART)
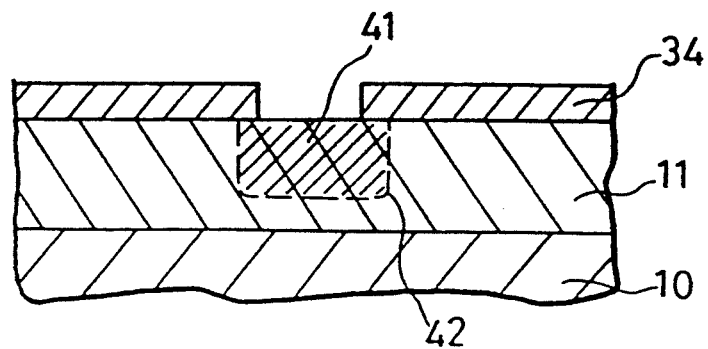
FIG. 7(c) (PRIOR ART)

METHOD OF DIFFUSING MERCURY INTO A CRYSTALLINE SEMICONDUCTOR MATERIAL INCLUDING MERCURY

FIELD OF THE INVENTION

The present invention relates to a method of diffusing Hg into a crystalline semiconductor including Hg, such as CdHgTe, ZnHgTe, or an alloy thereof, which is used in an infrared detector.

BACKGROUND OF THE INVENTION

As a compound semiconductor highly sensitive to infrared radiation, CdHgTe (cadmium mercury tellurium) is well known, and infrared detectors utilizing the photoconductivity of CdHgTe and photodiodes utilizing the photovoltaic effect of CdHgTe have been developed.

CdHgTe is generally frown on a CdTe substrate or a $Cd_xZn_{1-x}Te(x=0.97\sim0.98)$ substrate by LPE (Liquid Phase Epitaxy) or MOCVD (Metal Organic Chemical Vapor Deposition). Since the CdHgTe crystal includes Hg which has a very high vapor pressure, Hg is likely to be lost by dissociation during crystal growth, causing vacancies. Since the vacancies act as acceptors, the material grown by, for example, LPE is p type CdHgTe having a carrier concentration of $10^{16}\sim10^{17}$ cm$^{-3}$.

The photoconductivity of the p type CdHgTe, i.e., the variation of the electric conductivity with incident light is not so high, so that it is difficult to fabricate a photoconductive detector using the p type CdHgTe obtained by LPE. Therefore, after the crystal growth, Hg is diffused into the p type CdHgTe layer, whereby the p type CdHgTe layer is converted to n type which exhibits a higher photoconductivity.

FIGS. 5(a) to 5(c) are views for explaining a conventional Hg diffusion method disclosed in Japanese Patent Published Application No. 62-34157. FIG. 5(a) schematically shows a quartz ampoule 51 in which a sample 50 and Hg 61 are sealed. The sample 50 and the Hg 61 are separated from each other by the narrow part 52 of the quartz ampoule. FIG. 5(b) shows the sample 50 in detail, in which a CdHgTe crystal layer 101 having a thickness of $10\sim20$ microns is grown by LPE on a CdTe substrate 100 having a thickness of several hundreds of microns. FIG. 5(c) is a graph showing the temperature profile during the mercury diffusion.

The sample 50 shown in FIG. 5(b) and the Hg 61 are sealed up in the quartz ampoule 51 and annealed at the temperatures shown in FIG. 5(c) for 20 hours. During the annealing, Hg partial pressure from the Hg 61 is applied to the CdHgTe layer 101 of the sample 50 and then Hg atoms diffuse into the CdHgTe layer 101 and fill the Hg vacancies in that layer, whereby the p type CdHgTe layer 101 is converted to n type. A photoconductive detector is produced using the n type CdHgTe crystal layer thus formed.

As shown in the temperature profile of FIG. 5(c), the annealing is carried out with the temperature of the sample 50 kept higher than the temperature of the Hg reservoir to avoid the Hg from condensing on the surface of the CdHgTe layer when the temperature is reduced.

FIG. 6 is a cross-sectional view showing the structure of a pixel of a photodiode type infrared detector using a CdHgTe crystal layer as a light-to-electricity conversion layer. In FIG. 6, reference numeral 10 designates a CdTe substrate. A p type CdHgTe crystal layer 11 is disposed on the CdTe substrate 10 and an n type region 41 is formed in the CdHgTe layer 11 by diffusion of Hg. A p-n junction 42 is formed between the p type CdHgTe layer 11 and the n type region 41. A p side electrode 71 is disposed on the p type CdHgTe layer 11 where the n type region 41 is absent and an n side electrode 72 is disposed on the n type region 41. Reference numeral 33 designates an insulating protective film.

FIGS. 7(a) to 7(c) are cross-sectional views showing a method for fabricating the p-n junction 42 of the photodiode type infrared detector shown in FIG. 6. In these figures, reference numeral 34 designates a diffusion mask.

As shown in FIG. 7(a), a p type CdHgTe crystalline layer 11 is formed on the CdTe substrate 10 by LPE or the like. Then, as shown in FIG. 7(b), a diffusion mask 34 comprising such as ZnS and having an aperture opposing a pixel region is formed on the p type CdHgTe layer 11. The wafer shown in FIG. 7(b) is put in a quartz ampoule together with Hg, and Hg atoms are diffused into the CdHgTe crystal in the same way as shown in FIGS. 5(a)-5(c), resulting in an n type CdHgTe region 41 shown in FIG. 7(c) which serves as a pixel.

In the conventional Hg diffusion method, however, it is necessary to seal up the CdHgTe crystal 11 and the Hg 61 in the quartz ampoule, resulting in difficulty in handling. In addition, as shown in FIG. 5(c), the temperature difference between the CdHgTe crystal 11 and the Hg 61 in the quartz ampoule 51 is required. Furthermore, the size of the CdTe substrate and CdHgTe film is restricted to the diameter of the quartz ampoule 51, so that it is not possible to increase the size of the CdHgTe crystal.

SUMMARY OF THE INVENTION

It is an object of the present invention to provide a method of diffusing mercury into a crystalline semiconductor film including Hg, in which instruments and materials are easily handled, a complicated temperature profile is not required, and a diffusion of Hg into a large-sized crystalline film is possible.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a method of diffusing Hg into a crystalline semiconductor film including Hg comprises the steps of forming an amalgam layer on a region of the semiconductor crystal into which Hg is to be diffused; forming a protective film on the whole surface of the wafer; and an annealing to diffuse Hg from the amalgam layer into the semiconductor film. Therefore, a complicated temperature profile is not required and the diffusion of Hg into the semiconductor crystal is carried out without sealing up the wafer in an ampoule. As a result, instruments and materials are easily handled and the Hg diffusion into a large-sized film is possible.

DESCRIPTION OF THE DRAWINGS

FIG. 6 is a cross-sectional view showing a light detecting part of an infrared detector having a p-n junction; and FIGS. 7(a) to 7(c) are cross-sectional views illustrating a prior art Hg diffusion method for forming the p-n junction of the infrared detector shown in FIG. 6.

DETAILED DESCRIPTION OF THE INVENTION

Embodiments of the present invention will be described in detail with reference to the drawings.

FIGS. 1(a) to 1(d) are cross-sectional views illustrating a Hg diffusion method in accordance with first embodiment of the present invention.

Figure 1A:
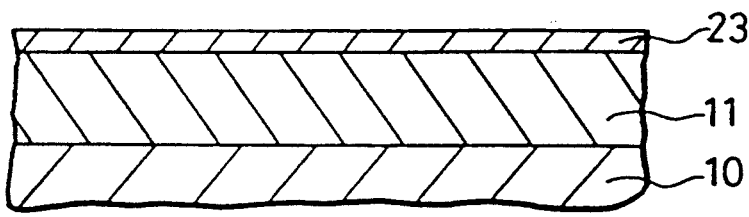
FIGS. 1(a) to 1(d) are cross-sectional views illustrating a method of Hg diffusion into a semiconductor film in accordance with a first embodiment of the present invention.

First of all, a CdTe substrate 10, on which a CdHgTe crystal layer 11 is formed by LPE, MOCVD or the like, is prepared. Then, as shown in FIG. 1(a), acadmium (Cd) layer 23 is deposited on the whole surface of the CdHgTe layer 11. The thickness of the Cd layer 23 may be chosen in accordance with a depth or a concentration of an Hg diffused region to be formed. For example, the Cd layer 23 should be several thousands of angstroms thick to form an Hg diffused region having a depth of about 10 microns.

Figure 1B:
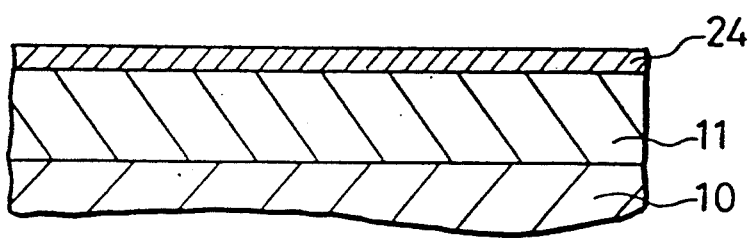

Then, the Cd layer 23 is exposed to Hg vapor or directly brought into contact with Hg to form an amalgam with the Cd layer 23, resulting in a Cd-Hg alloy (Cd amalgam) layer 24 shown in FIG. 1(b). It is well known that Cd, In or the like easily form an amalgam when exposed to Hg vapor at room temperature or when it is brought into direct contact with Hg. Accordingly, a high vapor pressure of mercury is not required for the amalgamation, so that the Hg treatment can be carried out at atmospheric pressure. For example, the substrate and Hg are put in a conventional reactive furnace, followed by an annealing to generate Hg vapor in the reactive furnace, whereby the Hg vapor is applied to the Cd layer 23. Alternatively, the substrate is dipped into an Hg bath to directly contact the Cd layer 23 with Hg. Thus, the Cd layer 23 is amalgamated.

In this first embodiment, the time for contacting the Cd layer with Hg, or the like, is controlled to form an amalgam layer in which the ratio of Hg by weight is approximately 10 to 15%.

Figure 2:
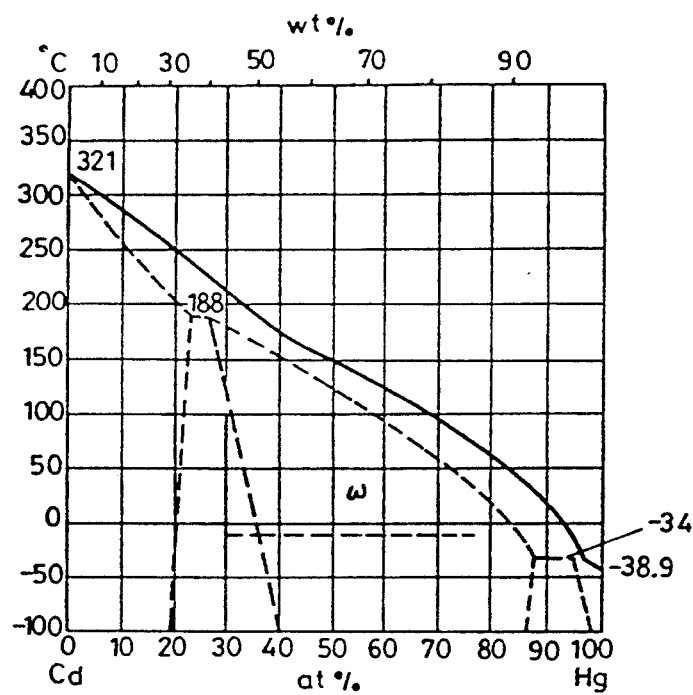
FIG. 2 is a constitutional diagram of an alloy of cadmium and mercury.

FIG. 2 is a graph of the constitution of a Cd amalgam. In FIG. 2, the solid line represents the change in the melting point of the Cd amalgam as a function of the ratio of Cd to Hg by weight. As can be seen in FIG. 2, the melting point of the Cd amalgam, in which the ratio of Hg by weight is 10 to 15%, is 250° to 300° C., so that the Cd amalgam remains in a solid state at a temperature below the melting point. Therefore, if the ratio of Hg in the amalgam is set to about 10 to 15%, the steps hereinafter can be carried out at 250° C. or below.

Figure 1C:
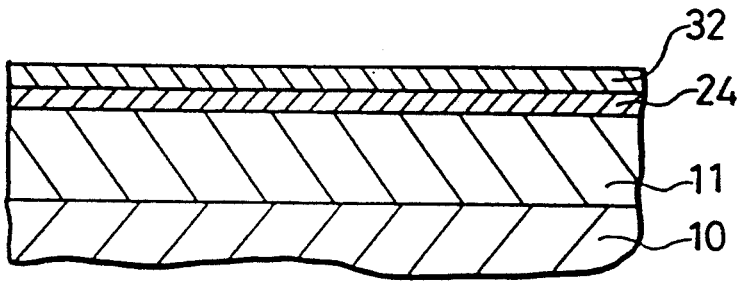
Figure 1D:
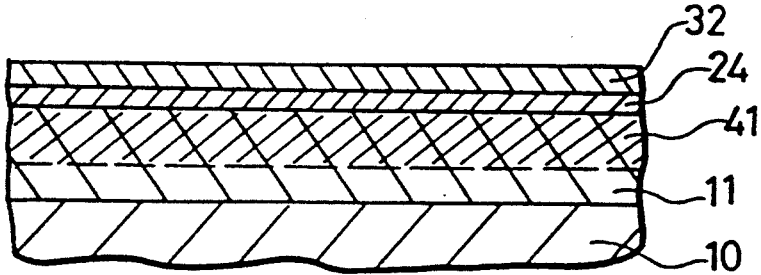

Then, as shown in FIG. 1(c), a ZnS film 32 is formed on the entire surface of the Cd amalgam layer 24 by MBE (molecular beam epitaxy), ECR plasma CVD (electron cyclotron resonance plasma chemical vapor deposition) or the like. By employing these methods a high quality ZnS film can be formed at a room temperature. Then, the wafer shown in FIG. 1(c) is annealed at 200° to 250° C. It is well known that the amalgam generates Hg vapor when heated up. The ZnS film 32 serves as a protective film against the Hg vapor and prevents the Hg vapor from escaping into the atmosphere, with the result that the Hg vapor diffuses only into the p type CdHgTe crystal layer 11. Thus, an n type CdHgTe region 41 is formed as shown in FIG. 1(d).

According to the first embodiment of the present invention, the Cd layer is deposited on the CdHgTe crystal layer and then the Cd amalgam is formed by Hg treatment. Thereafter, the protective film is formed on the whole surface of the wafer, followed by an annealing, whereby the Hg from the amalgam layer diffuses only into the CdHgTe crystal layer. Therefore, the diffusion of Hg can be carried out under the atmospheric pressure. As a result, handling is simplified and Hg diffusion into a large-sized film is possible, which has conventionally been impossible because the size of the film and substrate were restricted by the diameter of the quartz tube.

In the above-described first embodiment, Hg is diffused over the whole surface of the p type CdHgTe film to convert it into the n type CdHgTe crystal, which is needed for fabricating, for example, a photoconductive infrared detector. However, the present invention may also be applied to a case where Hg is diffused into a prescribed region of a semiconductor crystal to form a p-n junction of, for example, a photodiode type infrared detector.

FIGS. 3(a) to 3(e) are cross-sectional views illustrating a method of Hg diffusion into a prescribed region of a semiconductor film in accordance with a second embodiment of the present invention. In these figures, the same references as those in FIGS. 1(a) to 1(d) designate the same or corresponding parts.

Figure 3A:
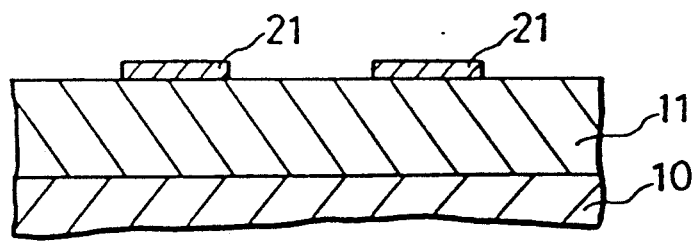
FIGS. 3(a) to 3(e) are cross-sectional views illustrating a method of Hg diffusion into a semiconductor film in accordance with a second embodiment of the present invention.

First of all, a CdTe substrate 10, on which a p type CdHgTe crystalline layer 11 is formed by LPE, MOCVD or the like, is prepared. Then, as shown in FIG. 3(a), Cd patterns 21, corresponding to pixel regions, are formed on the CdHgTe layer 11. The Cd patterns 21 are formed by the following method. That is, a resist pattern is formed on a region other than the pixel region and then Cd is deposited on the whole surface and, thereafter, the resist pattern is removed together with the Cd on the resist pattern, i.e., the so-called deposition and lift-off method. Alternatively, Cd is deposited on the whole surface of the CdHgTe layer 11 and then the Cd on region other than the pixel region is removed by photolithography and etching. The thickness of the Cd pattern 21 may be chosen in accordance with a depth or a concentration of an Hg diffusion layer to be formed. For example, the Cd pattern 21 should be several thousands of angstroms thick to form a diffusion layer having a depth of about 10 microns.

Figure 3B:
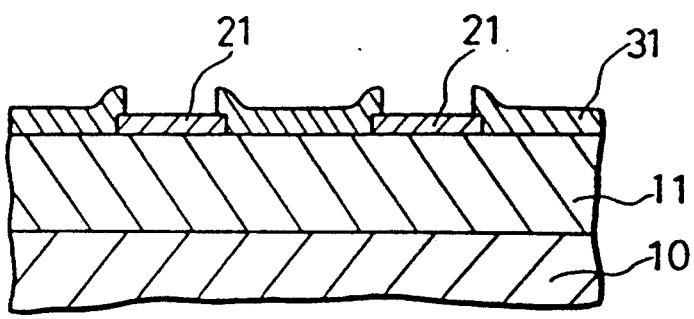

Then, a ZnS film is formed on the whole surface of the wafer and portions of the ZnS film on the Cd patterns 21 are removed by photolithography and etching resulting in a ZnS pattern 31 shown in FIG. 3(b).

Figure 3C:
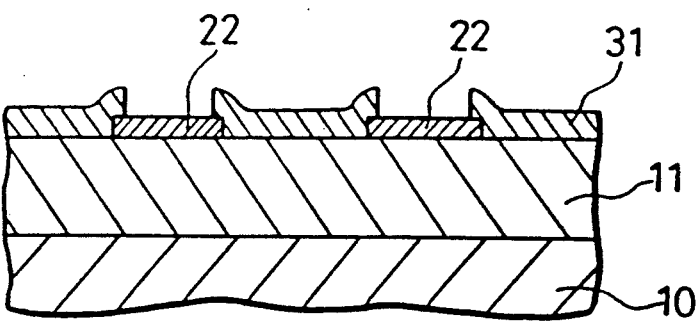

Then, the wafer shown in FIG. 3(b) is exposed to Hg vapor or directly brought into contact with Hg, to form an amalgam the Cd patterns 21, resulting in Cd amalgam patterns 22 shown in FIG. 3(c). At this time, the ZnS film 31 serves as a protective film, so that the surface of the CdHgTe layer 11 masked by the ZnS film 31 is no exposed to the Hg treatment. Also in this second embodiment, the Hg treatment condition is controlled to form a amalgam in which the ratio of Hg by weight is 10 to 15%. The protective film 31 may be a nitride film like $SiN_x$ or an oxide film like $SiO_x$.

Figure 3D:
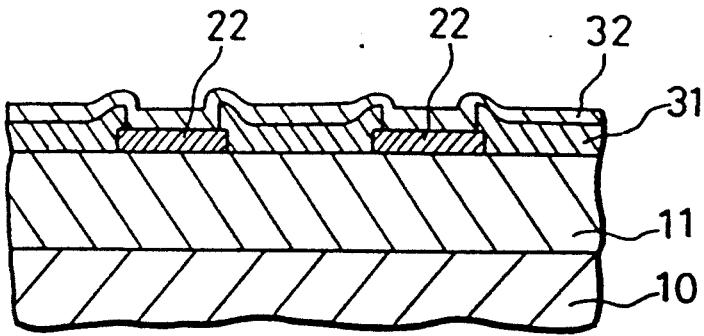
Figure 3E:
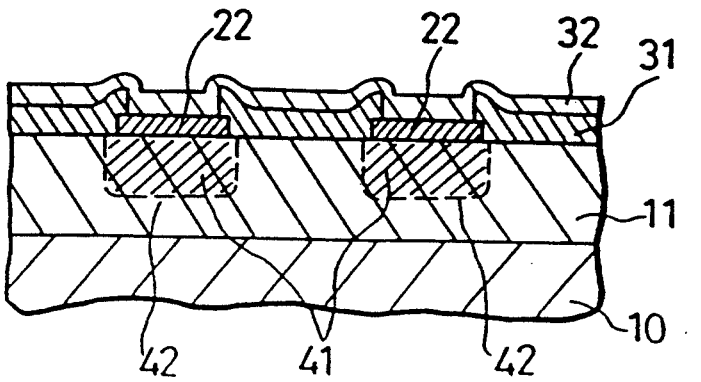

After forming the amalgam patterns 22, a ZnS film 32 is formed on the whole surface of the wafer as shown in FIG. 3(d). Although the ZnS film 31 remains beneath the ZnS film 32 in FIG. 3(d), it may be removed before forming the ZnS film 32. Then, the wafer shown in FIG. 3(d) is annealed at 200° to 250° C. It is well known that amalgam generates Hg vapor when heated up. The ZnS film 32 serves as a protective film against the Hg vapor and prevents the Hg vapor from escaping into the atmosphere, with the result that the Hg diffuses only into the p type CdHgTe crystal layer 11. Thus, n type CdHgTe regions 41 are formed in the p type CdHgTe layer 11 and p-n junctions 42 are formed at the diffusion front.

According to the second embodiment of the present invention, Cd patterns are formed on regions of the CdHgTe layer into which Hg should be diffused. Thereafter, the protective film is formed on the whole surface of the wafer, followed by the annealing, whereby Hg from the amalgam is diffused into the CdHgTe crystal. Therefore, Hg diffusion having a desired pattern is easily carried out under the atmospheric pressure. In addition, Hg diffusion into a large-sized film is possible.

FIGS. 4(a) to 4(e) are cross-sectional views illustrating a method of Hg diffusion into a semiconductor film in accordance with a third embodiment of the present invention. In these figures, the same references as those in FIGS. 3(a) to 3(d) designate the same or corresponding parts. While in the above-described second embodiment metal patterns are formed on prescribed regions of the semiconductor crystal so that Hg only diffuses into the prescribed regions, In this third embodiment metal is deposited on the whole surface of the semiconductor crystal and a dielectric film having apertures corresponding to regions into which Hg should be diffused is formed on the metal layer, followed by an Hg treatment using the dielectric film as a mask, portions of the metal layer exposed to the surface form an amalgam and Hg diffuses into desired regions of the semiconductor crystal.

The process steps will be described in detail with reference to FIGS. 4(a) to 4(e).

Figure 4A:
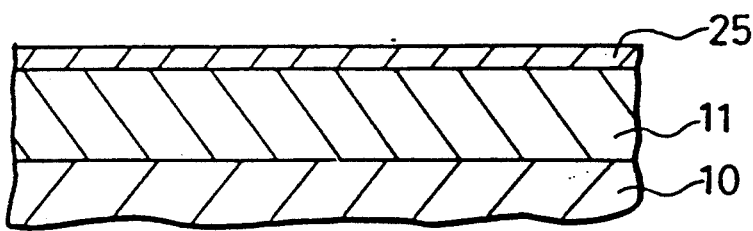
FIGS. 4(a) to 4(e) are cross-sectional views illustrating a method of Hg diffusion into a semiconductor film in accordance with a third embodiment of the present invention.

First of all, a CdTe substrate 10, on which a p type CdHgTe crystal layer 11 is formed by LPE, MOCVD or the like, is prepared. Then, as shown in FIG. 4(a), a Cd layer 25 is deposited on the whole surface of the wafer. The thickness of the Cd layer 25 may be chosen in accordance with the depth or a concentration of an Hg diffusion region to be formed.

Figure 4B:
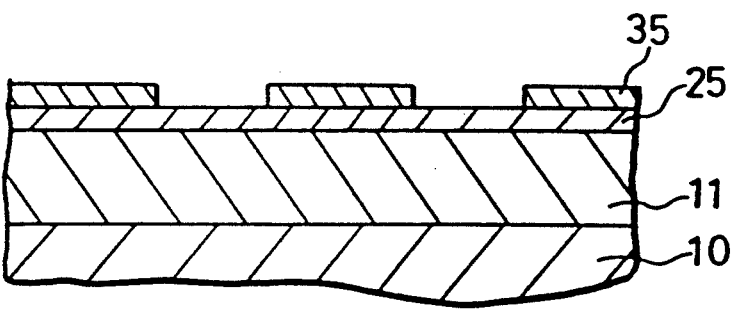

Then, as shown in FIG. 4(b), a ZnS film 35 having apertures corresponding to Hg diffusion regions is formed on the Cd layer 25. The ZnS film 35 is formed by depositing ZnS on the Cd layer 25 by vapor deposition, MBE, CVD or the like, followed by a patterning using photolithography and etching.

Figure 4C:
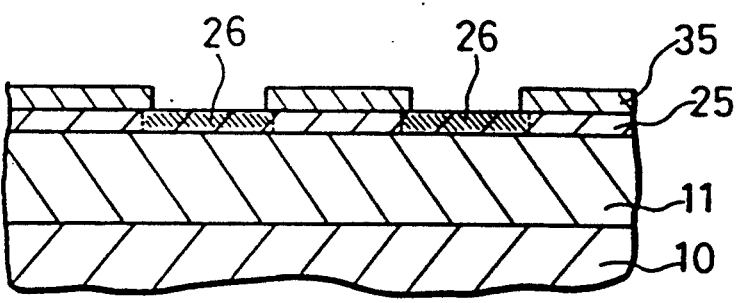

Then, the wafer shown in FIG. 4(b) is exposed to Hg vapor or directly brought into contact with Hg, to form an amalgam the Cd layer 25 exposed on the surface, resulting in Cd amalgam regions 26 shown in FIG. 4(c). At this time, the ZnS film 35 serves as a protective film, so that the Hg is not applied to the portions of the Cd layer 25 masked by the ZnS film 35. Also in this third embodiment, the Hg treatment conditions are controlled to form an amalgam in which the ratio of Hg by weight is 10 to 15%. In addition, the protective mask 31 may be a nitride film like $SiN_x$ or an oxide film like $SiO_x$.

Figure 4D:
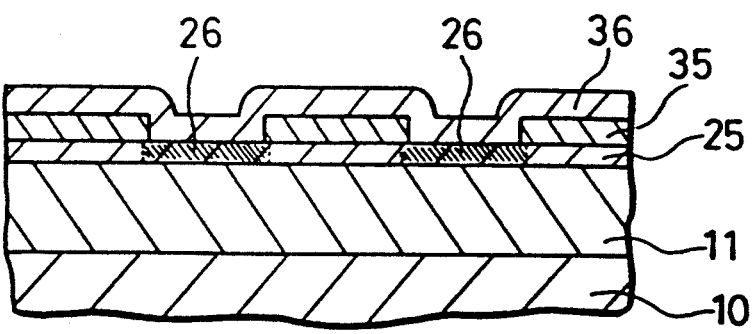
Figure 4E:
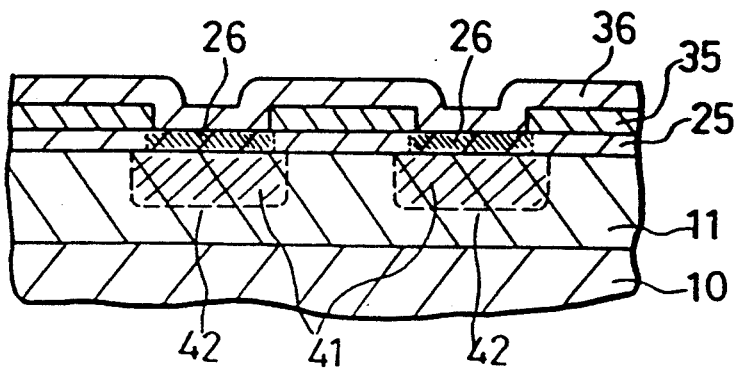
Figure 5A:
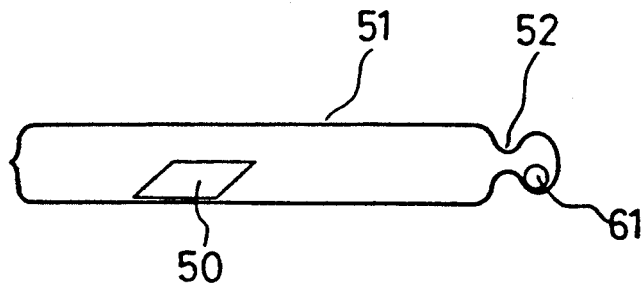
FIGS. 5(a) to 5(c) are diagrams for explaining a prior art method of Hg diffusion into a semiconductor film in a quartz ampoule.
Figure 5B:
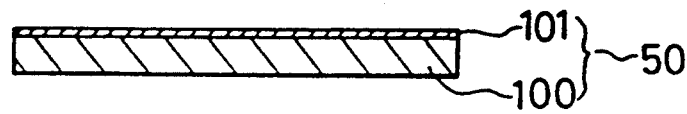
Figure 5C:
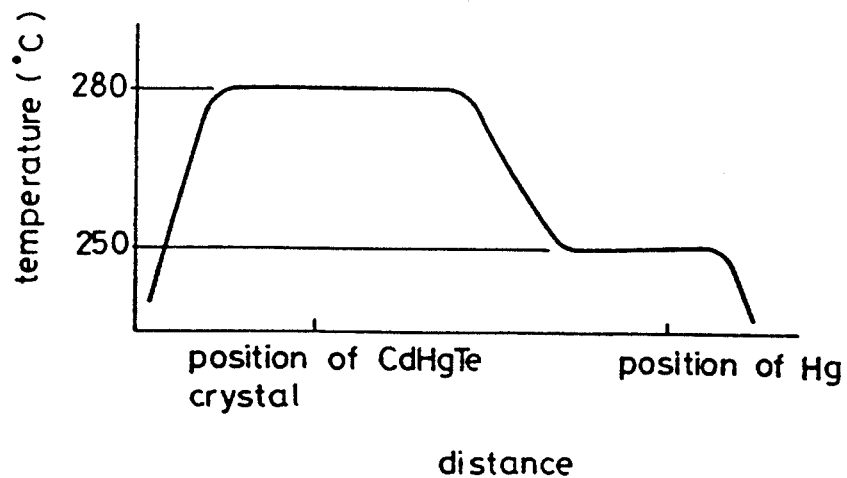

After forming the amalgam regions 26, a ZnS film 36 is formed on the whole surface of the wafer as shown in FIG. 4(d). Although the ZnS film 35 remains beneath the ZnS film 36 in FIG. 4(d), it may be removed before forming the ZnS film 36. When the wafer shown in FIG. 4(d) is annealed at 200° to 250° C., Hg diffuses from the Cd amalgam regions 26. The ZnS film 36 serves as a protective film against Hg vapor and prevents Hg vapor from diffusing into the atmosphere, so that the Hg diffuses only into the p type CdHgTe crystal layer 11. Thus, n type CdHgTe regions 41 are formed in the p type CdHgTe layer 11 and p-n junctions 42 are formed at the diffusion front.

While in the above-illustrated first to third embodiments cadmium is deposited on the semiconductor crystal and amalgamated to form an Hg diffusion source, indium, which is easily amalgamated like cadmium, may be used in place of cadmium. Also in this case, the same effects as described above can be achieved. In addition, metals other than cadmium and indium may be used so long as they are easily amalgamated.

While in the above-illustrated first to third embodiments a ZnS film is used as the protective film for preventing the Hg from the Hg amalgam from diffusing into the atmosphere, the protective film may be a nitride film like $SiN_x$ or an oxide film like $SiO_x$ with the same effects as described above.

While in the above-illustrated embodiments CdHgTe is empolyed as the crystalline semiconductor film including Hg, the present invention may be applied to ZnHgTe or an alloy of CdHgTe and ZnHgTe. There is no restriction on the composition of these semiconductors.

As is evident from the foregoing description, according to the present invention an amalgam is formed on a region of a semiconductor crystal into which Hg is to be diffused, a protective film is formed on the whole surface of the wafer, and the wafer is annealed to diffuse Hg from the amalgam into the semiconductor film. Therefore, a complicated temperature profile is not required and the Hg diffusion is carried out without sealing the wafer in a quartz tube. As a result, instruments and materials are easily handled and an Hg diffusion into a large-sized film is possible.

What is claimed is:

1. A method of diffusing mercury (Hg) into a crystalline compound semiconductor film including Hg comprising:
   forming an amalgam on a region of a crystalline semiconductor film into which Hg is to be diffused;
   forming a protective film on the film covering the amalgam; and
   annealing the film so that Hg from the amalgam diffuses into the film while the protective film prevents Hg from escaping.

2. The method of claim 1 wherein forming the amalgam comprises depositing a metal on the semiconductor film and treating the metal with Hg.

3. The method of claim 2 including forming the metal only on a prescribed region of thee semiconductor film into which Hg is to be diffused.

4. The method of claim 3 including forming a resist film on the semiconductor film except at a region into which Hg is to be diffused, depositing the metal on the resist film and exposed semiconductor film, and removing the resist film, leaving the metal on the region of the semiconductor crystal into which Hg is to be diffused.

5. The method of claim 3 including patterning the metal using photolithography and etching, leaving metal on a region of the semiconductor crystal into which Hg is to be diffused.

6. The method of claim 2 including forming a dielectric film having apertures corresponding to regions into which Hg is to be diffused on the metal and treating the metal film with Hg using the dielectric film as a mask, whereby the amalgam is formed on portions of the metal exposed through the dielectric film.

7. The method of claim 6 including forming the dielectric film of ZnS.

8. The method of claim 2 wherein the metal is selected from the group consisting of cadmium and indium.

9. The method of claim 8 including treating the metal with Hg at an elevated temperature at atmospheric pressure to apply Hg vapor to the metal, whereby amalgam is formed.

10. The method of claim 8 including dipping the semiconductor film into an Hg bath to form the amalgam with the metal.

11. The method of claim 1 including depositing ZnS as the protective film.

12. The method of claim 1 including forming a film selected from the group consisting of $SiN_x$ and $SiO_x$ as the protective film.

13. The method of claim 2 wherein the semiconductor film is CdHgTe.

14. The method of claim 13 wherein a portion of the CdHgTe film is converted to n type by the annealing.

* * * * *